(12) United States Patent
Matsuda et al.

(10) Patent No.: US 11,158,776 B2
(45) Date of Patent: Oct. 26, 2021

(54) LEAD FRAME AND METHOD OF MANUFACTURING LIGHT EMITTING DEVICE

(71) Applicant: NICHIA CORPORATION, Anan (JP)

(72) Inventors: Kazuya Matsuda, Anan (JP); Naofumi Sumitani, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/922,868

(22) Filed: Jul. 7, 2020

(65) Prior Publication Data
US 2021/0013387 A1 Jan. 14, 2021

(30) Foreign Application Priority Data
Jul. 9, 2019 (JP) .............................. JP2019-127899

(51) Int. Cl.
*H01L 33/62* (2010.01)
*H01L 23/495* (2006.01)

(52) U.S. Cl.
CPC ........ *H01L 33/62* (2013.01); *H01L 23/49548* (2013.01); *H01L 2933/0066* (2013.01)

(58) Field of Classification Search
CPC .............. H01L 33/62; H01L 23/49548; H01L 2933/0066; H01L 2224/48257; H01L 2224/97; H01L 2224/73265; H01L 2224/32245; H01L 2224/48247; H01L 2224/48091; H01L 23/49861; H01L 23/49562; H01L 23/49565
See application file for complete search history.

(56) References Cited

U.S. PATENT DOCUMENTS

2005/0104169 A1* 5/2005 Huat ................. H01L 23/49541
257/666
2012/0015463 A1* 1/2012 Oyabu .................... H01L 24/97
438/27
2013/0221509 A1 8/2013 Oda et al.
(Continued)

FOREIGN PATENT DOCUMENTS

JP 2012191233 A 10/2012
JP 2013165259 A 8/2013
(Continued)

*Primary Examiner* — Victor A Mandala
(74) *Attorney, Agent, or Firm* — Global IP Counselors, LLP

(57) ABSTRACT

A lead frame includes a plurality of unit structures, an outer frame, a plurality of extending portions, and a plurality of coupling portions. The unit structures each includes a first lead portion and a second lead portion aligned in a first direction, and grouped into first and second groups including a plurality of the unit structures aligned in the first direction. The extending portions each includes a first extending portion extending in the second direction and connecting the first lead portions of the unit structures in the first and second groups a second extending portion connecting the second lead portions of the unit structures in the first and second groups. The coupling portions connect all the first extending portions and the second extending portions. At least one of the extending portions located at one of ends in the first direction is not directly connected to the outer frame.

16 Claims, 15 Drawing Sheets

(56) References Cited

U.S. PATENT DOCUMENTS

| | | | |
|---|---|---|---|
| 2014/0020926 A1* | 1/2014 | Feng | H01L 21/4821 |
| | | | 174/68.1 |
| 2014/0252574 A1* | 9/2014 | Nakabayashi | H01L 23/49503 |
| | | | 257/666 |
| 2014/0252582 A1* | 9/2014 | Nakabayashi | H01L 23/49562 |
| | | | 257/676 |
| 2015/0200138 A1* | 7/2015 | Schlereth | H01L 21/50 |
| | | | 257/666 |
| 2016/0064633 A1* | 3/2016 | Park | H01L 24/97 |
| | | | 438/27 |
| 2016/0343512 A1* | 11/2016 | Chiu | H01G 9/26 |
| 2018/0269137 A1 | 9/2018 | Oku et al. | |
| 2018/0331084 A1 | 11/2018 | Ukawa et al. | |
| 2019/0020155 A1* | 1/2019 | Trout | H01R 24/78 |
| 2020/0203289 A1* | 6/2020 | Ching, Jr. | H01L 23/49541 |

FOREIGN PATENT DOCUMENTS

| | | | | |
|---|---|---|---|---|
| JP | 2016051856 A | 4/2016 | | |
| JP | 2016181653 A | 10/2016 | | |
| JP | 2017005247 A | 1/2017 | | |
| JP | 2018157086 A | 10/2018 | | |
| JP | 2018157088 A | 10/2018 | | |
| JP | 2018195622 A | 12/2018 | | |
| JP | 2019087703 A | 6/2019 | | |
| WO | 2012060336 A1 | 5/2012 | | |
| WO | WO2012060336 | * | 5/2012 | 33/62 |

\* cited by examiner

B

LEAD FRAME AND METHOD OF MANUFACTURING LIGHT EMITTING DEVICE

CROSS-REFERENCE TO RELATED PATENT APPLICATION

The present application claims priority under 35 U. S. C. § 119 to Japanese Patent Application No. 2019-127899, filed Jul. 9, 2019. The contents of Japanese Patent Application No 2019-127899 are incorporated herein by reference in their entirety.

BACKGROUND

Technical Field

The present disclosure relates to a lead frame and a method of manufacturing a light emitting device.

Description of Related Art

Light emitting devices that have been widely used generally include a package formed with a resin material or the like to accommodate a light emitting element and provided with electrically conductive leads for supplying electricity to the light emitting element. Such light emitting devices are generally manufactured through providing a plurality of packages each accommodating a predetermined number of light emitting elements disposed on a resin-attached lead frame, which is then singulated into individual light emitting devices, for example, by using a cutting blade. When singulating, locations between the light emitting devices where the blade is applied generally have portions where an extending portion of the lead frame that connects adjacent light emitting devices present and portions where the extending portion does not present as shown in Re-publication of PCT international publication No. 2012-060336.

SUMMARY OF THE INVENTION

The presence or absence of an extending portion of the lead frame results in different degrees of stress acting on the cutting blade. The different degrees of stress may cause defects such as positional deviation of the cutting blade from its predetermined cutting line. For this reason, a lead frame or a method of manufacturing a light emitting device that can avoid the occurrence of defects caused by the shape of the lead frame used in the manufacturing has been desired.

A lead frame according to certain embodiments of the present disclosure includes a plurality of unit structures, an outer frame, a plurality of extending portions, and a plurality of coupling portions. The unit structures each includes a first lead portion and a second lead portion aligned in a first direction. The unit structures are grouped into a first group including a plurality of the unit structures aligned in the first direction, and a second group including a plurality of the unit structures aligned in the first direction. The second group is adjacent to the first group in a second direction perpendicular to the first direction. The outer frame surrounds the first group and the second group. The extending portions each includes a first extending portion extending in the second direction and connecting the first lead portion of one of the unit structures in the first group and the first lead portion of a corresponding one of the unit structures in the second group, and a second extending portion extending in the second direction and connecting the second lead portion of one of the unit structures in the first group and the second lead portion of a corresponding one of the unit structures in the second group. The coupling portions are located between the first group and the second group, and connect all the first extending portions and the second extending portions located between the first group and the second group. At least one of the extending portions located at one of ends in the first direction is not directly connected to the outer frame.

A method of manufacturing a light emitting device according to certain embodiments of the present disclosure includes: providing a resin-attached lead frame that includes the lead frame as described above, and a resin member covering a portion of the lead frame; mounting at least one light emitting element on a first surface of the first lead portion or the second lead portion of each of the unit structures; removing the outer frame from the lead frame; and cutting the coupling portions of the lead frame along the first direction to separate the first group and the second group.

Using the lead frame according to certain embodiments of the present disclosure, a failure in cutting due to the shape of the lead frame can be avoided. When using the lead frame in manufacturing light emitting devices, a failure in cutting due to the shape of the lead frame can be avoided.

DETAILED DESCRIPTION OF THE EMBODIMENTS

Figure 1A:
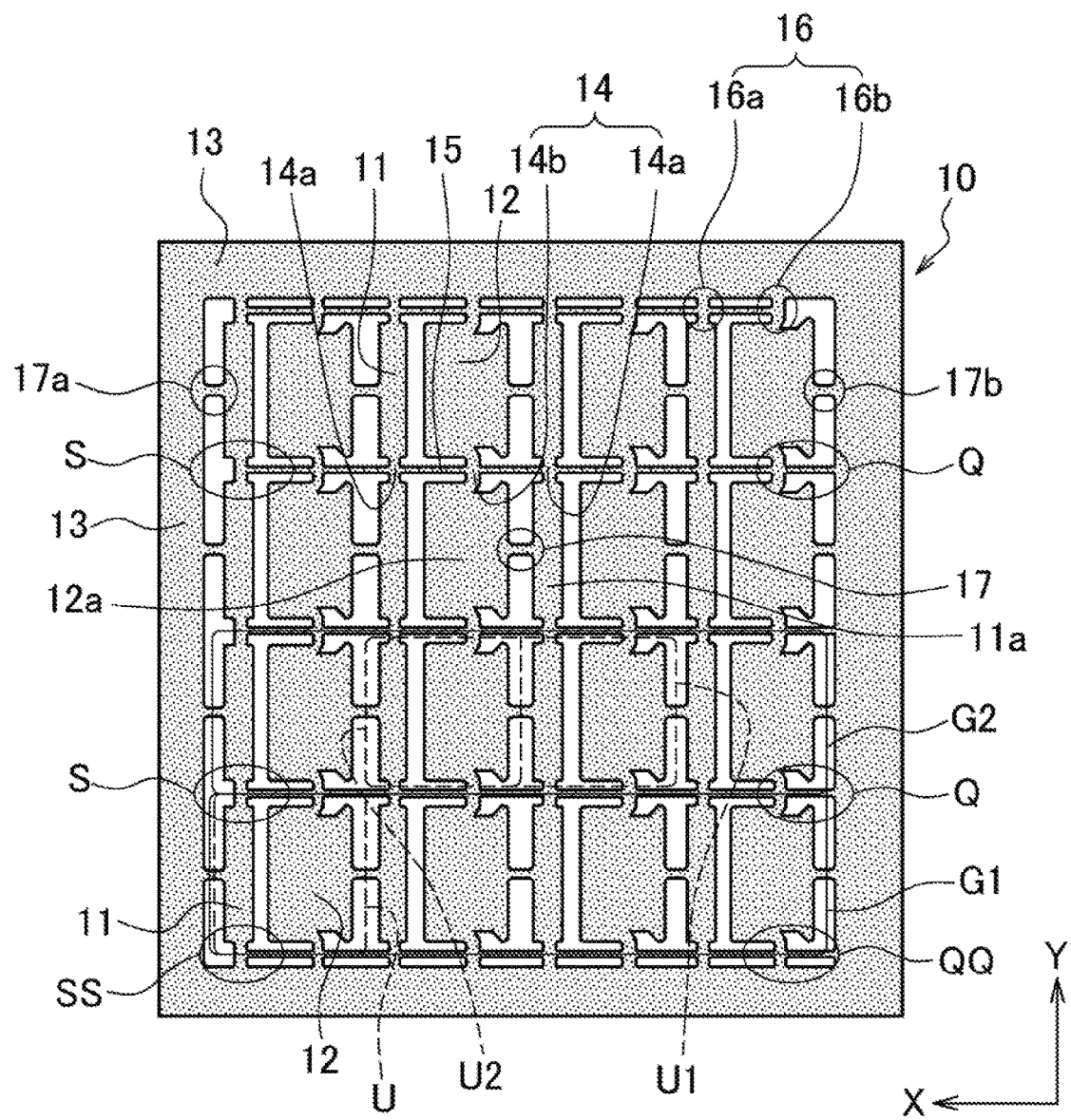
FIG. 1A is a schematic plan view showing a lead frame according to a first embodiment of the present disclosure.

Next, a light emitting device and a method of manufacturing a light emitting device will be described below. The drawings referred to in the description below are to schematically illustrate the embodiments, and the size, a space or interval, locational relationship of the components and so forth may be exaggerated or a portion of a component may not be shown. In the description below, the same designations or the same reference numerals denote the same or like members and duplicative descriptions will be appropriately omitted.

In the present specification and drawings, the term "first direction" indicates a lateral direction (X-direction), and the term "second direction" indicates a longitudinal direction (Y-direction) orthogonal to the first direction. In the present specification, the term "parallel" allows a variation in an angle of ±10°.

Lead Frame 10

Figure 1B:
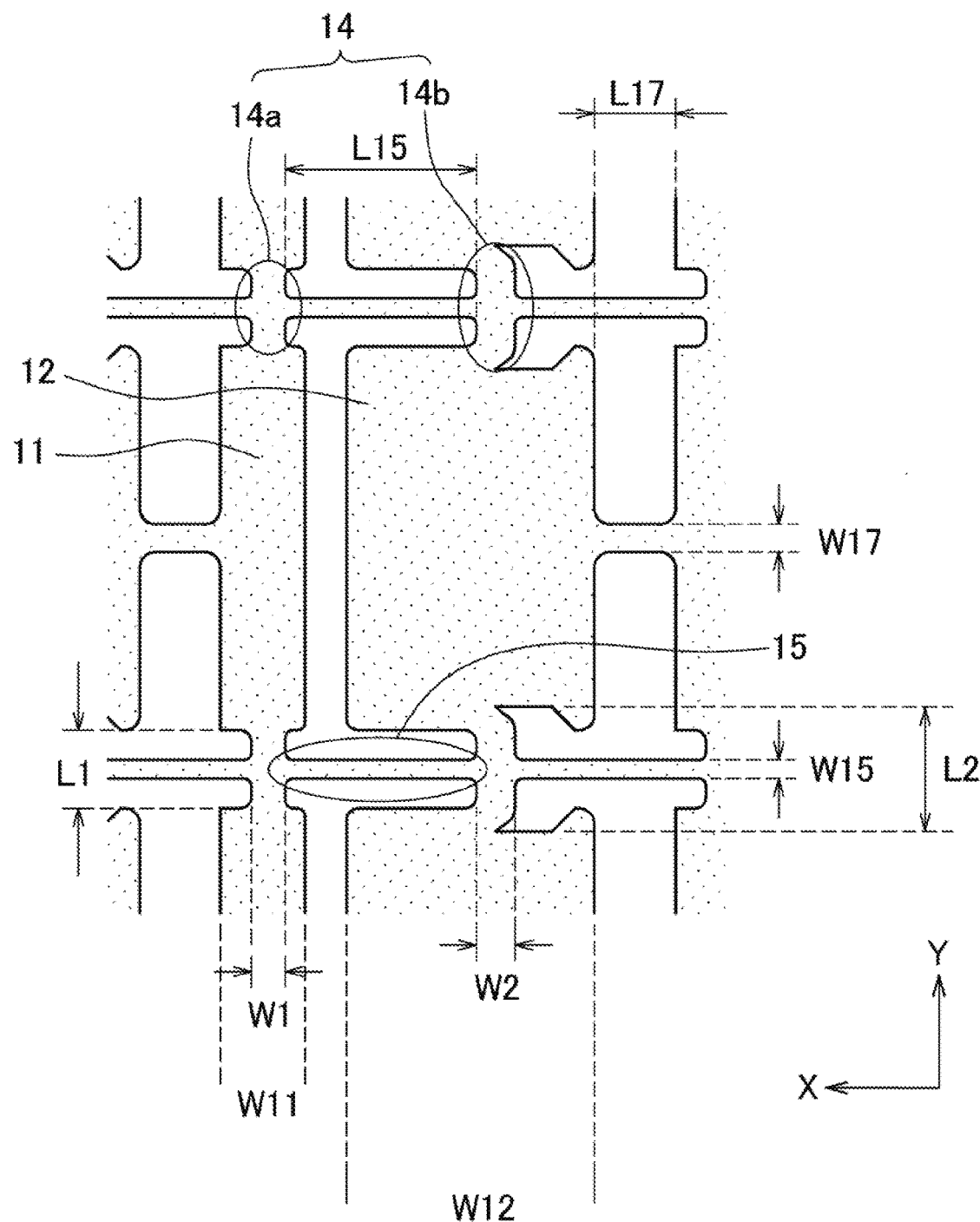
FIG. 1B is a partially enlarged view of FIG. 1A.

As shown in FIG. 1A and FIG. 1B, the lead frame 10 includes a plurality of unit structures U aligned in a first direction (X-direction) and a second direction (Y-direction), each of the unit structures U including a first lead portion 11 and a second lead portion 12 arranged in a first direction (X-direction). In this configuration, the unit structures U are arranged such that the first lead portion 11 and the second lead portion 12 are alternately arranged in the first direction. The unit structures U can be aligned such that, in the second direction, portions of the plurality of the first lead portions 11 and portions of the plurality of the second lead portions 12 are not located on the same straight line or are located on the same straight line. The first lead portions 11 and the second lead portions 12 are electrically conductive. The first lead portion 11 and the second lead portion 12 included in each unit structure U are configured to serve as electrodes to supply electricity to at least one light emitting element in a singulated light emitting device.

A plurality of the unit structures U are arranged in the first direction. The plurality of the unit structures U arranged in the first direction constitute a first group G1. Also, a plurality of the unit structures U are respectively arranged adjacent to the unit structures U of the first group G1 in the second direction. The plurality of the unit structures U respectively arranged adjacent to the unit structures U of the first group G1 in the second direction constitute a second group G2.

In an example shown in FIG. 1A, four unit structures U are respectively arranged in the first direction and the second direction. The number of the unit structures U arranged in the first direction and the second direction can be appropriately determined. For example, as shown in FIG. 4B, nine unit structures U can be arranged in the first direction and ten unit structures U can be arranged in the second direction.

Figure 4A:
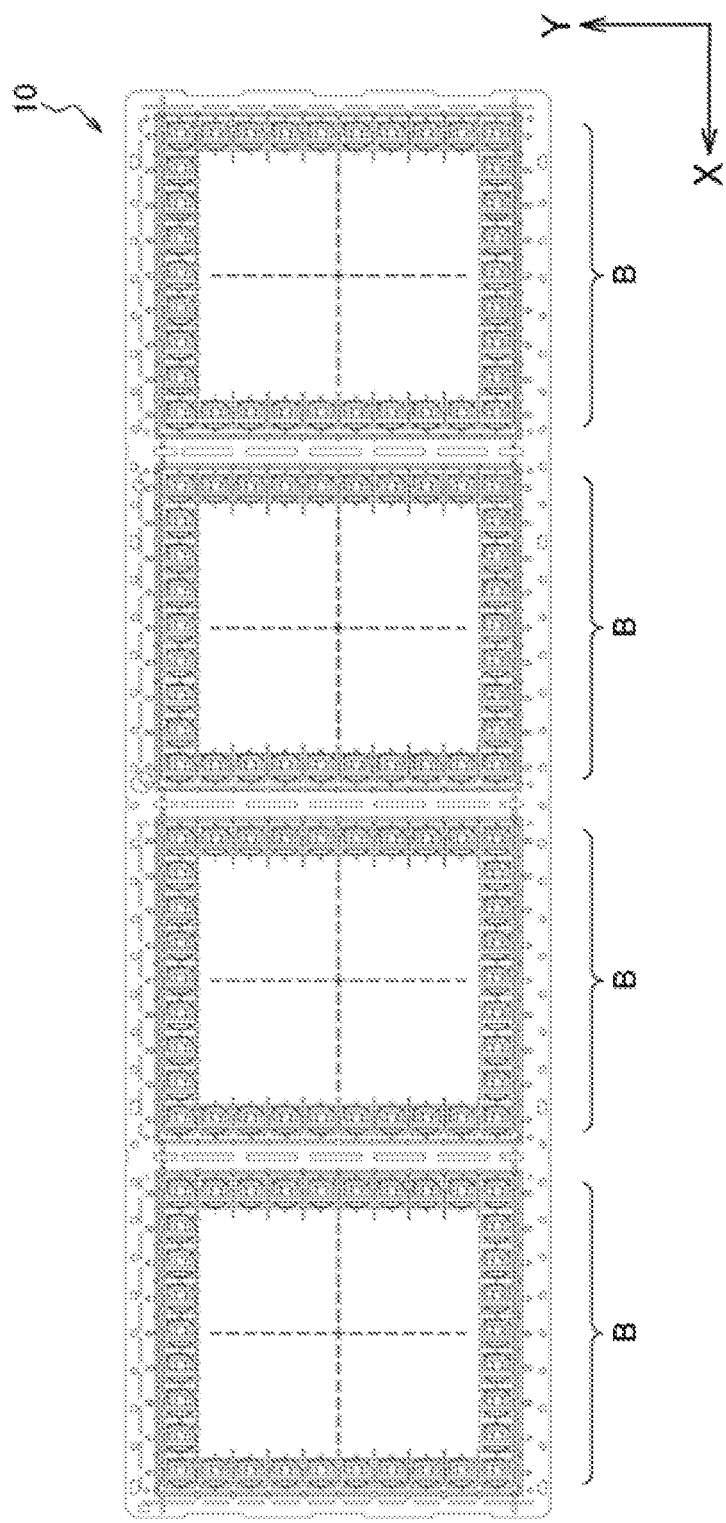
FIG. 4A is a schematic plan view showing a modified example of a lead frame shown in FIG. 1A.
Figure 4B:
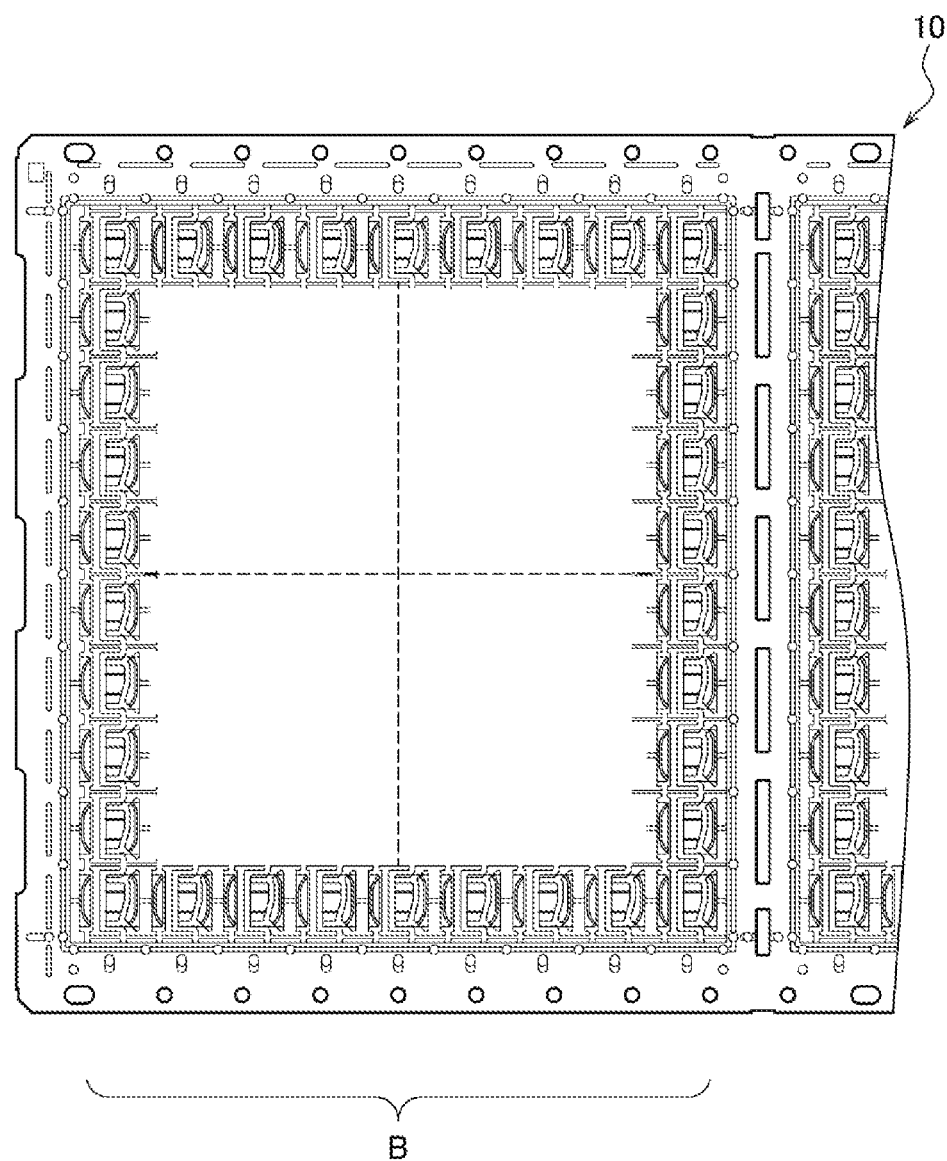
FIG. 4B is a partially enlarged view of the lead frame shown in FIG. 4A.

As shown in FIG. 4A, according to the number of the unit structures U, the lead frame 10 may include a plurality of blocks B each including a plurality of the unit structures U aligned in the first direction (X-direction). In the present specification, the term "block B" refers to a plurality of the unit structures U arranged in a matrix shape in the first direction and the second direction. In order to support each lead portion, the lead frame 10 includes reinforcing portions between adjacent blocks B. With the reinforcing portions between adjacent blocks B, bending of the lead frame 10 can be reduced or prevented.

The first group G1 and the second group G2 can be aligned alternately in the second direction (Y-direction) in a single lead frame 10 or in a single block B. In FIG. 1A etc., for the simplicity of explanation, sixteen of the unit structures U are set in the lead frame 10 having a substantially square outer shape. As shown in FIG. 4A, the lead frame 10 preferably has an outer peripheral shape substantially rectangular in a plan view, more preferably with long sides substantially in parallel to the first direction (X-direction). In such a shape, the coupling portions, which will be described below, respectively extend in the first direction (X-direction), such that bending of the lead frame 10 can be reduced or prevented.

An outer frame 13 surrounds the first group G1 and the second group G2. In other words, the lead frame 10 is provided with the outer frame 13. The outer frame 13 can be provided to surround the entirety or a part of the first group G1 and the second group G2. When the outer frame 13 is provided to surround the entirety of the first group G1 and the second group G2, bending of the lead frame can be reduced or prevented more efficiently.

An extending portion 14 including a first extending portion 14a and a second extending portion 14b is arranged between the unit structures U adjacent to each other in the second direction (Y-direction). Each of the first extending portions 14a extends in the second direction (Y-direction) and connects the first lead portion 11 of the first group G1 and the first lead portion 11 of the second group G2. Each of the second extending portions 14b extends in the second direction (Y-direction) and connects the second lead portion 12 of the first group G2 and the second lead portion 12 of the second group G2.

In FIG. 1A, one first extending portions 14a and one second extending portions 14b are arranged between two unit structures U adjacent to each other in the second direction, but an appropriate number of the first extending portions 14a and the second extending portions 14b can be provided between the two adjacent unit structures U. That is, one or more first extending portions 14a and one or more second extending portions 14b can be provided between respective portions of the two unit structures U adjacent to each other in the second direction. In FIG. 1A, the first extending portions 14a and the second extending portions 14b connect the center portion of the first lead portions 11 and the second lead portions 12, respectively, in the first direction (X-direction). However, the first extending portions 14a and the second extending portions 14b may be provided to connect end portions of the first lead portions 11 and the second lead portions 12, respectively, in the first direction (X-direction).

The outer peripheries of the first extending portions 14a and/or the second extending portions 14b that face a portion of the outer frame 13 extending in the second direction in a plan view are preferably substantially in parallel to the second direction (Y-direction). With this arrangement, the lengths of the first extending portions 14a and/or the second extending portions 14b in the second direction (Y-direction) can be minimized. With the smaller lengths of first extending portions 14a and/or the second extending portions 14b, bending of the lead frame can be reduced or prevented.

Figure 2A:
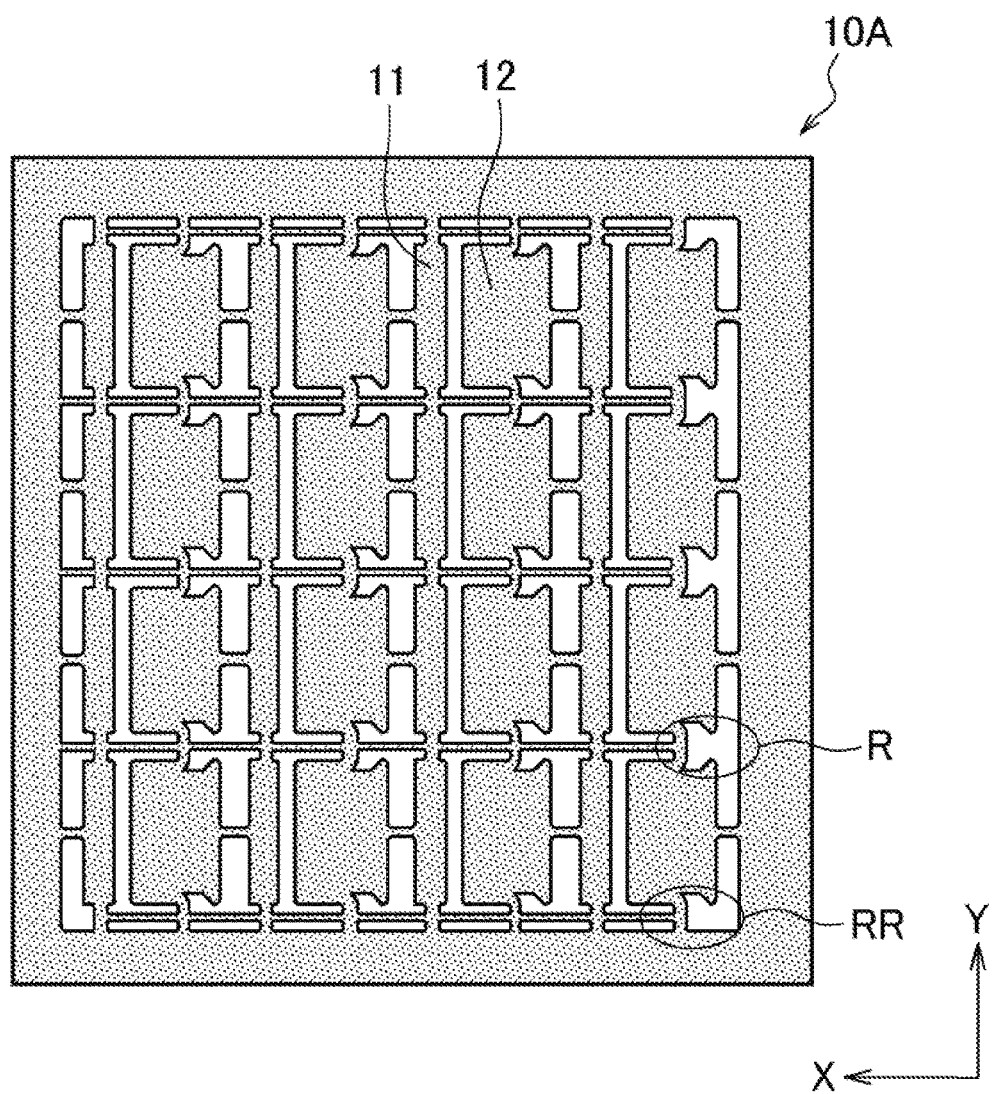
FIG. 2A is a schematic plan view of a variational example shown in FIG. 1A.
Figure 2B:
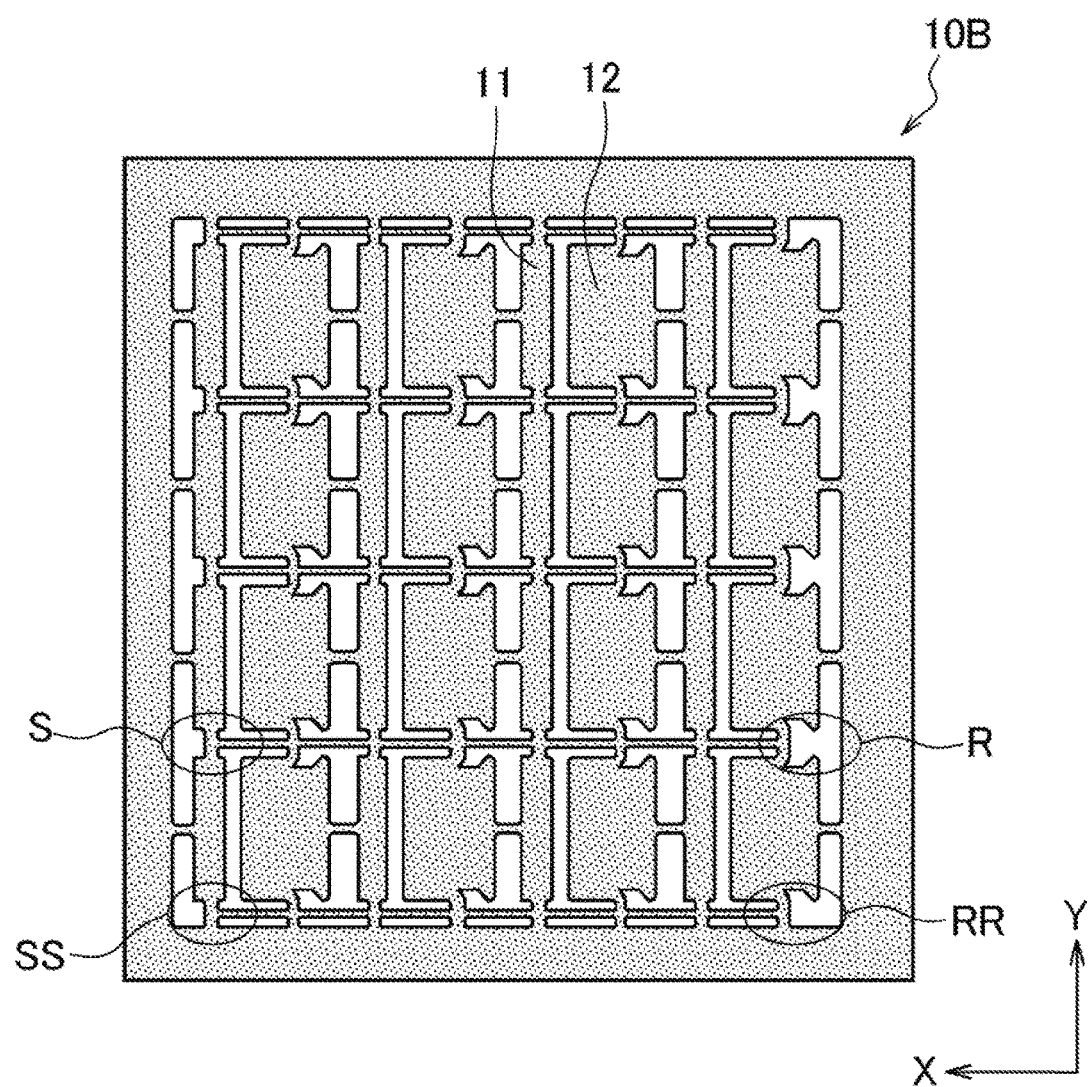
FIG. 2B is a schematic plan view of another variational example shown in FIG. 1A.

Further, coupling portions 15 are provided connecting all the first extending portions 14a with respective adjacent second extending portions 14b located between the first group G1 and the second group G2. At least one of the first extending portion 14a and the second extending portion 14b located at the end in the first direction (X-direction) between the first group G1 and the second group G2 is not provided with a portion extending in the first direction (X-direction) connected to the outer frame 13 extending in the second direction (Y-direction). For example, as indicated by encircled regions "S" in FIG. 1A, the lead frame does not have extending portions extending in the first direction (X-direction) and connecting the outer frame 13 and each of the first extending portions 14a located at the end in the first direction and between the first group G1 and the second group G2. Alternatively, for example, as indicated by an encircled region "R" in FIG. 2A, the lead frame 10A does not have extending portions extending in the first direction (X-direction) and connecting the outer frame 13 and each of the second extending portions 14b located at the end in the first direction and between the first group G1 and the second group G2. Further alternatively, for example, as indicated by encircled regions "S" and "R" in FIG. 2B, the lead frame 10B does not have extending portions extending in the first direction (X-direction) and connecting the outer frame 13 and the first extending portion 14a and the second extending portion 14b located at the both ends in the first direction between the first group G1 and the second group G2.

At the time of singulating the packages, for example, when the portions between the packages, where portions of the lead frame are embedded in the resin member, are cut by a blade as will be described below, a change in cutting resistance acting on the blade may result in a positional deviation of the blade from a predetermined cutting line. In particular, when the packages are singulated by cutting using a blade, a positional deviation of the blade from a predetermined cutting line tends to occur when the blade is applied on a lead portion at an initiation of cutting, or when the blade is rotating away from the cutting object immediately after cutting the lead frame portion at an ending of cutting. Such a locational deviation may result in a failure in obtaining highly accurate cutting in singulating the packages from the lead frame having a plurality of packages. On the other hand, as described above, in the lead frame according to the present embodiment, at least one of the first extending portion 14a and the second extending portion 14b located at the end in the first direction between the first group G1 and the second group G2 are not directly connected to the outer frame 13. With this arrangement, at the time of singulation, for example, at the initiation or at the ending of cutting the lead frame, only the portions of the resin member, absent of the coupling portion 15, can be subjected to the cutting. With this arrangement, even when a rotary blade is used for cutting, gradual transition of cutting from the resin member to the lead frame or gradual transition of cutting from the lead frame to the resin member can be achieved, such that stress on the rotary blade can be gradually changed. As a result, the positional deviation of the rotary blade can be reduced or prevented.

At least one of the coupling portions 15 is totally embedded in the resin member. In other words, at least one coupling portion 15 is not exposed from the resin member. When the lead frame includes a plurality of coupling portions 15, all the coupling portions 15 are preferably embedded in the resin member, such that any of the coupling portions 15 are not exposed from the resin member.

In addition to the portions between the first group G1 and the second group G2 adjacent to the first group G1, the lead frame preferably includes the coupling portions 15 between the portions of the outer frame 13 extending in the first direction (X-direction) and the first group G1 or the second group G2 adjacent to respective portions of the outer frame 13, while at least one of the first extending portion 14a and the second extending portion 14b located at the end in the first direction does not have a coupling portion connected to the portion of the outer frame 13 extending in the second direction (Y-direction). For example, as indicated by an encircled region "SS" in FIG. 1A, between the outer frame 13 extending in the first direction (X-direction) and the first group G1 or the second group G2, the lead frame 10 preferably does not include a coupling portion connecting the portion of the outer frame 13 extending in the second direction (Y-direction) and the first extending portion 14a located at an end in the first direction. Alternatively, for example, as indicated by an encircled region "RR" in FIG. 2A, between the outer frame 13 extending in the first direction (X-direction) and the first group G1 or the second group G2, the lead frame 10A preferably does not include a coupling portion connecting the portion of the outer frame 13 extending in the second direction (Y-direction) and the second extending portion 14b located at an end in the first direction. Further alternatively, for example, as indicated by encircled regions "SS" and "RR" in FIG. 2B, between the outer frame 13 extending in the first direction (X-direction) and the first group G1 or the second group G2, the lead frame 10B preferably does not include coupling portions respectively connecting the portion of the outer frame 13 extending in the second direction (Y-direction) and the first extending portion 14a and the second extending portion 14b located at both ends in the first direction.

The coupling portions 15 are preferably disposed substantially in parallel to the first direction (X-direction) in a plan view. When the coupling portions 15 are substantially in parallel to the first direction (X-direction) in a plan view, the widths of the coupling portions 15 in the second direction (Y-direction) can be easily reduced. With this arrangement, distances between the first group G1 and the second group G2 adjacent to the first group G1 in the second direction (Y-direction) can be reduced, which allows an increase in the number of the first group and/or second group G2 adjacent to the first group G1 arranged in the second direction (Y-direction) in the lead frame of a given size.

As shown in FIG. 1B, the extending portions 14 have widths in the second direction (Y-direction) preferably smaller than the width of the coupling portions 15 in the first direction (X-direction). That is, of the extending portions, the first extending portions 14a have a width L1 in the second direction (Y-direction) and the second extending portions 14b have a width L2 in the second direction (Y-direction) respectively smaller than the width L15 of the coupling portions 15 in the first direction (X-direction). Such smaller widths of the extending portions 14 in the second direction (Y-direction) may allow an increase in the number of the first groups G1 and/or the second groups G2 arranged in the second direction, in the lead frame of a given length in the second direction (Y-direction). For example, the coupling portions 15 have a width L15 in a range of 30 to 90%, preferably in a range of 40 to 80% with respect to the width L1 of the first extending portions 14a. Also, the width L15 of the coupling portions 15 can be in a range of 10 to 90%, preferably in a range of 30 to 80% with respect to the width L2 of the second extending portions 14b. The coupling portions 15 have a width W15 in the second direction, for example, in a range of 20 to 30%, with respect to the width L1 of the first extending portions 14a. More specifically, the coupling portions 15 have a width W15 in the second direction, for example, in a range of 0.05 to 0.5 mm, preferably in a range of 0.1 to 0.3 mm, more preferably in a range of 0.1 to 0.15 mm.

In the first direction, the extending portions 14 have a width preferably smaller than the width of the first lead portions 11 and the width of the second lead portions 12. That is, the first extending portions 14a have a width W1 preferably smaller than the width W1 of the first lead portions 11. For example, the first extending portions 14a have a width W1 in a range of 30 to 90%, preferably in a range of 40 to 80% with respect to the width W1 of the first lead portions 11. In the first direction, the second extending portions 14b have a width W2 preferably smaller than the width W12 of the second lead portions. The second extending portions 14b have a width in a range of 10 to 90%, preferably in a range of 30 to 80% with respect to the width W12 of the second lead portions 12. In the first direction, the first lead portions 11 have a width W11 in a range of 10 to 90%, preferably in a range of 20 to 80% with respect to the width W12 of the second lead portions 12. In the first direction, the first extending portions 14a have a width W1 in a range of 50 to 150%, preferably in a range of 80 to 120% with respect to the width W2 of the second extending portions 14b.

As shown in FIG. 1A, the lead frame 10 preferably includes first connecting portions 16a extending in the second direction (Y-direction) and connecting the outer frame 13 and the first lead portions 11 located adjacent to the outer frame 13, and second connecting portions 16b extending in the second direction (Y-direction) and connecting the outer frame 13 and the second lead portions 12 located adjacent to the outer frame 13. With this arrangement, the unit structures and the outer frame are connected through the connecting portions, which allows an increase in the mechanical strength of the lead frame and a decrease in bending of the lead frame.

Also, as shown in FIG. 1A, each of the unit structures U included in the lead frame 10 has the first lead portion 11 and the second lead portion 12 spaced apart from each other, that is, the first lead portion 11 and the second lead portion 12 are not directly connected in each of the unit structures U. It is preferable that two unit structures U (a first unit structure U1 and a second unit structure U2) that are adjacent to each other in the first direction are preferably connected to each other by a holding portion 17 connecting the first lead portion 11a of the first unit structure U1 and the second lead portion 12a of the second unit structure U2. The holding portions 17 are preferably disposed substantially in parallel to the first direction (X-direction). A plurality of holding portions 17 or a single holding portion 17 may be disposed between the first lead portion 11a and the second lead portion 12a of adjacent unit structures in the first direction. The holding portions 17 are set to be cut, as described later below. When a single holding portion 17 is provided between the first lead portion 11a and the second lead portion 12a of adjacent unit structures, cutting can be performed easily while securing mechanical strength of the first lead portions 11 and the second lead portions 12 with respect to the entire lead frame.

It is preferable that the lead frame 10 further includes first holding portions 17a extending in the first direction connecting the outer frame 13 and the first lead portions 11 located adjacent to the outer frame 13 and second holding portions 17b extending in the first direction connecting the outer frame 13 and the second lead portions 12 located adjacent to the outer frame 13.

In FIG. 1A, the holding portions 17, 17a, and 17b are connected to the first lead portions 11 and the second lead portions 12 respectively at or near the center in the second direction, but may be connected to appropriate locations of the first lead portions 11 and the second lead portions 12 such as to edge portions.

The widths of the holding portions 17, 17a, and 17b in the second direction (Y-direction) may be different from one another, may be partially different, or partially different or the same. In the present specification, the term "same width" allows a variation in a width of ±5%. The holding portions 17, 17a, and 17b have widths in the second direction (Y-direction) preferably smaller than the widths L17 of the holding portions 17, 17a, and 17b in the first direction (X-direction). With the smaller widths W17 in the second direction (Y-direction) the holding portions 17, 17a and 17b can be easily cut in the second direction (Y-direction).

The holding portions 17, 17a, and 17b have widths W17 in the second direction (Y-direction) equal to or greater than the widths W15 of the coupling portions 15 in the second direction (Y-direction). With the holding portions 17, 17a and 17b having greater widths W17 in the second direction (Y-direction), bending of the lead frame can be reduced or prevented. For example, the widths W17 of the holding portions 17, 17a, and 17b in the second direction (Y-direction) can be in a range of 30 to 100%, preferably in the range of 50 to 90% with respect to the widths W15 of the coupling portions 15. Also, the widths W17 of the holding portions 17, 17a, and 17b in the second direction (Y-direction) are preferably smaller than the width W1 of the first extending portions 14a and the width W2 of the second extending portions 14b. For example, the widths W17 of the holding portions 17, 17a, and 17b in the second direction (Y-direction) can be in a range of 30 to 90%, preferably in the range of 40 to 80% with respect to the width W1 of the first extending portions 14a. Also, the widths W17 of the holding portions 17, 17a, and 17b can be in a range of 10 to 90%, preferably in a range of 30 to 80% with respect to the width W2 of the second extending portions 14b.

Figure 3A:
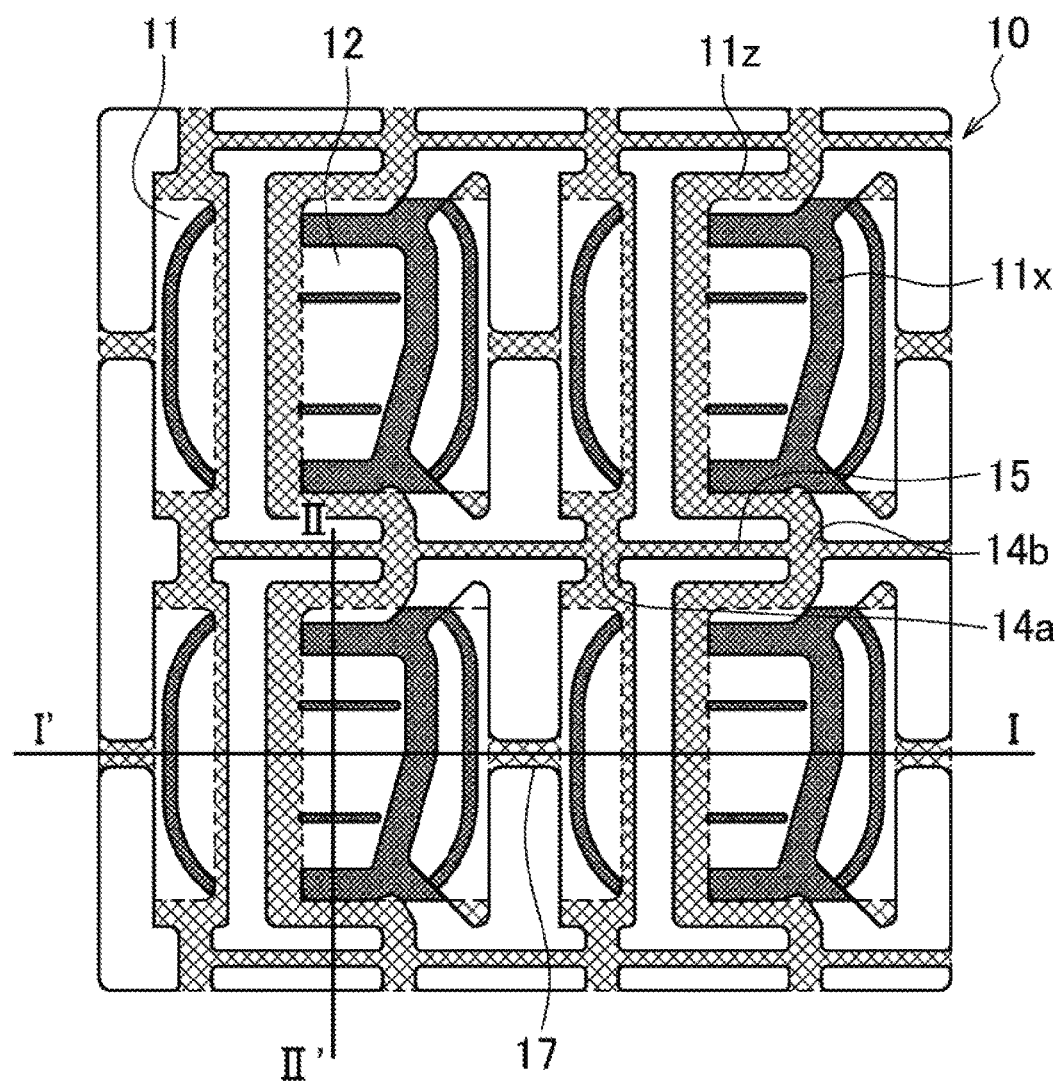
FIG. 3A is a schematic plan view of another variational example shown in FIG. 1A, partially enlarged and viewed through to indicate recesses.
Figure 3B:
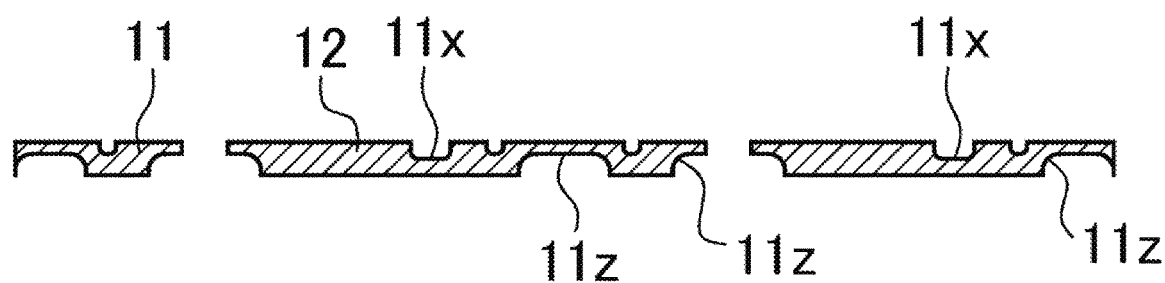
FIG. 3B is a sectional view taken along line I-I' of FIG. 3A.
Figure 3C:
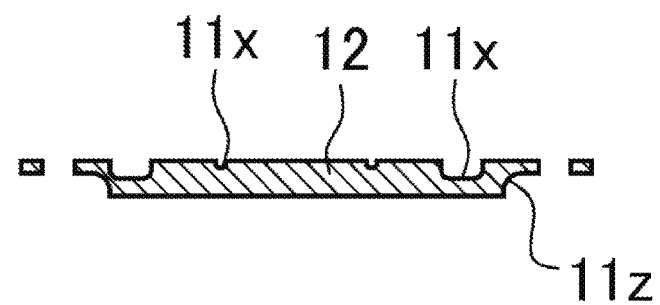
FIG. 3C is a sectional view taken along line II-II' of FIG. 3A.

As shown in FIG. 3A to FIG. 3C, the lead frame 10 preferably defines a plurality of first recesses 11x in the surface on which the light emitting elements are to be mounted and/or a plurality of second recesses 11z in the surface opposite from the surface for mounting the light emitting elements, as will be described below. In the present specification, the surface on which the light emitting elements are to be mounted may be referred to as the first surface or the upper surface, and the surface opposite side of the surface on which the light emitting elements are to be mounted may be referred to as the second surface or the lower surface. FIG. 3A is a schematic plan view, viewed through to indicate the positional relationship of the first recesses 11x defined in the upper surface of the lead frame 10 and the second recesses 11z defined in the lower surface of the lead frame 10.

The first recess 11x can be formed with any appropriate number, width, length, planar shape, or the like. For example, the first recesses 11x can be formed in shapes respectively extending from the outer ends of the first lead portions 11 and/or second lead portions 12. This arrangement allows for disposing of the resin member to be described below on the surface having the light emitting element(s) mounted thereon, such that reliable adhesion between the resin member and the lead frame can be obtained. In a plan view, the first recesses 11x may be formed to surround a portion or all of the outer perimeter of the light emitting element(s) disposed in the first recesses 11x. With this arrangement, a bonding member used to bond the light emitting element(s) and the lead frame can be prevented from excessively wet-spreading. Further, when the light emitting element(s) is wire-bonded on the upper surface of the first lead portion 11 and/or the second lead portion 12, the first recesses 11x may be formed to surround a portion or all of the outer perimeter of respective bonding regions. The first recesses 11x preferably formed with a depth from the upper surfaces of the first lead portions 11 in a range of 10 to 50% with respect to the maximum thickness of the first lead portions 11.

In a plan view, the second recesses 11z are preferably formed to surround a portion or all of the outer perimeter of the lower surfaces of the first lead portions 11 and/or the second lead portions 12. With the resin member disposed in the second recesses 11z of the first lead portions 11 and/or the second lead portions 12, adhesion between the resin member and the first lead portions 11 and/or the second lead portion 12 can be improved. The second recesses 11z are preferably formed not to be overlapped with the first recesses 11x in a plan view. With this arrangement, portions with smaller thicknesses due to both the first recess and the second recess are not formed in the first lead portions 11 and/or the second lead portions 12 such that a reduction in the mechanical strength of the first lead portions 11 and/or the second lead portions 12 can be prevented. It is preferable that the second recesses 11z are also formed in lower surfaces of the extending portions 14, the coupling portions 15, connecting portions 16 and/or holding portions 17, 17a, and 17b, etc. The second recess 11z can be formed with any appropriate number, width, length, planar shape, or the like. The second recesses 11z may be formed with a depth from the lower surfaces of the first lead portions 11 and/or the second lead portions 12 in a range of 10 to 50% with respect to 12 the maximum thickness of the first lead portions 11 and/or the second lead portions 12.

The first lead portions 11 and the second lead portions 12 can be formed using, for example, a metal such as copper, aluminum, gold, silver, iron, nickel, or an alloy of one or more of those metals, phosphor bronze, iron copper, and can be formed in predetermined shapes using a technique such as rolling, punching, extruding, or wet or dry etching, or a combination of such techniques. The first lead portions 11 and the second lead portions 12 may have a single-layer structure or a multi-layer structure (for example, a cladding material). In particular, copper that is inexpensive and has high heat dissipation performance is preferably used. The lead frame has a thickness of, for example, in a range of 0.1 to 2 mm, preferably in a range of 0.1 to 1 mm.

When needed, for example, in order to improve reflectance, the first lead portions 11 and the second lead portions 12 can be provided with a reflection film in a form of a metal plating of silver, aluminum, copper, and/or gold, disposed on portions of or on whole surfaces of the first lead portions 11 and the second lead portions 12 in a single layer or in a layered structure. When a metal layer containing silver is formed on the outermost layers of the first lead portions 11 and the second lead portions 12, a protective layer made of silicon oxide or the like is preferably disposed on the outermost layers of the first lead portions 11 and the second lead portions 12. With the protective layer, discoloration of the metal layer containing silver due to sulfur compounds in the atmospheric air can be reduced or prevented. The protective layer can be disposed by using a known technique such as sputtering in a vacuum.

The first recesses 11x and/or the second recesses 11z defined in the first lead portions 11 and/or the second lead portions 12 can be formed by employing press working, half-etching, or the like. For example, dry etching or wet etching can be adopted for etching. An appropriate etchant suitable for the material(s) of the first lead portions 11 and the second lead portions 12 can be employed. More specifically, when copper is used for the first lead portions 11 and the second lead portions 12, a common soft etching agent for copper made of a persulfate or hydrogen peroxide and an inorganic acid, iron chloride or copper chloride and an inorganic acid, or a copper-ammonia complex and an ammonium salt can be suitably used. When etching is employed, depths of the first recesses 11x and/or the second recesses 11z can be adjusted appropriately by adjusting etching conditions such as etching time.

Lead frames having unit structures U each including a single first lead portion and a single second lead portion have been illustrated referring to FIG. 1 etc. Similar can be applied in the lead frames having unit structures U each including two first lead portions and two second lead portions adapted for light emitting devices including four terminals. When a single unit structure U includes four lead portions for four terminals, the four lead portions are preferably spaced apart from one other in each unit structure. A single unit structure U may include a third lead portion.

Method of Manufacturing Light Emitting Device

The method of manufacturing a light emitting device according to one embodiment of the present invention, the method includes providing a resin-attached lead frame 20 that includes the lead frame 10 described above and a resin member 21 covering a portion of the lead frame 10; mounting at least one light emitting element 22 on a first surface of the first lead portion 11 or the second lead portion 12 of each of the unit structures described above; removing the outer frame 13 from the lead frame 13; and cutting the coupling portions 15 of the lead frame 10 along the first direction (X-direction) to separate the first group G1 and the second group G2 adjacent to the first group G1.

Further, optionally, the method preferably includes cutting the holding portions 17, 17a, and 17b in the second direction to separate the unit structures adjacent in the second direction. The step of cutting in the second direction is preferably performed after the step of cutting in the first direction. The volumes of the holding portions 17, 17a, and 17b set to be cut in the second direction are smaller than the volumes of the coupling portions 15 set to be cut in the first direction (X-direction). With this arrangement, cutting the holding portions 17, 17a, and 17b having smaller volumes in the second direction when separating individual unit structures can reduce resistance acting on the blade. With this arrangement, a positional deviation of the blade can be reduced or prevented.

Providing Resin-Attached Lead Frame

The lead frame 10 described above is provided.

Figure 5A:
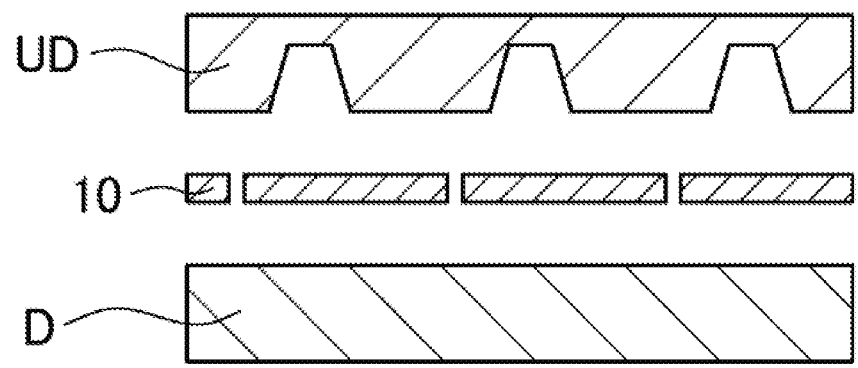
FIG. 5A is a schematic end surface view for illustrating a method of manufacturing a light emitting device according to one embodiment of the present disclosure.
Figure 5B:
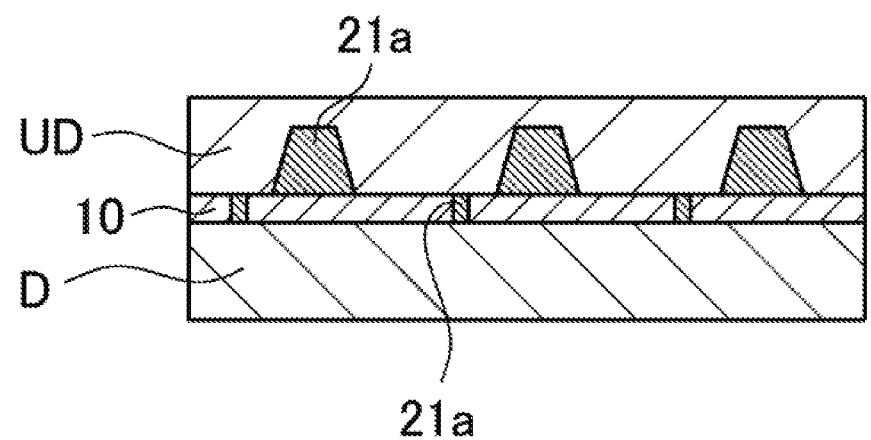
FIG. 5B is a schematic end surface view for illustrating a method of manufacturing a light emitting device according to one embodiment of the present disclosure.

Next, as shown in FIG. 5A, the lead frame 10 is set between an upper mold UD and a lower mold D. Then, as shown in FIG. 5B, an uncured resin 21a is injected in a space formed between the upper mold UD and the lower mold D.

After filling the space with the uncured resin 21a, heat is applied to pre-cure the resin. Then, the lead frame with the pre-cured resin attached thereto is removed from the upper mold UD and the lower mold D. Heat is applied to the pre-cured resin attached lead frame at a temperature higher than at the pre-curing to complete curing of the resin material 21a. Accordingly, the resin member 21 is disposed on the lead frame 10, and the resin-attached lead frame 20 shown in FIG. 5C can be obtained.

Figure 5C:
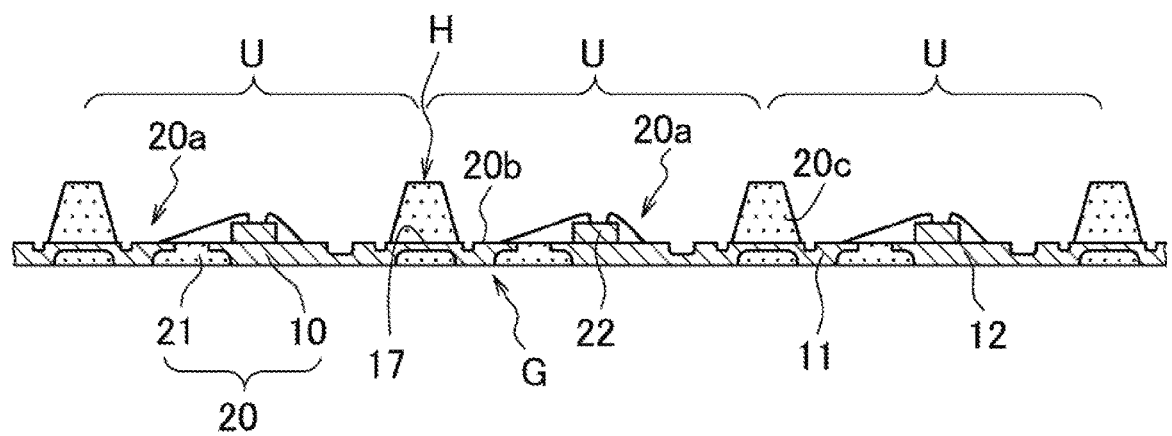
FIG. 5C is a schematic end surface view for illustrating a method of manufacturing the light emitting device according to one embodiment of the present disclosure.
Figure 5D:
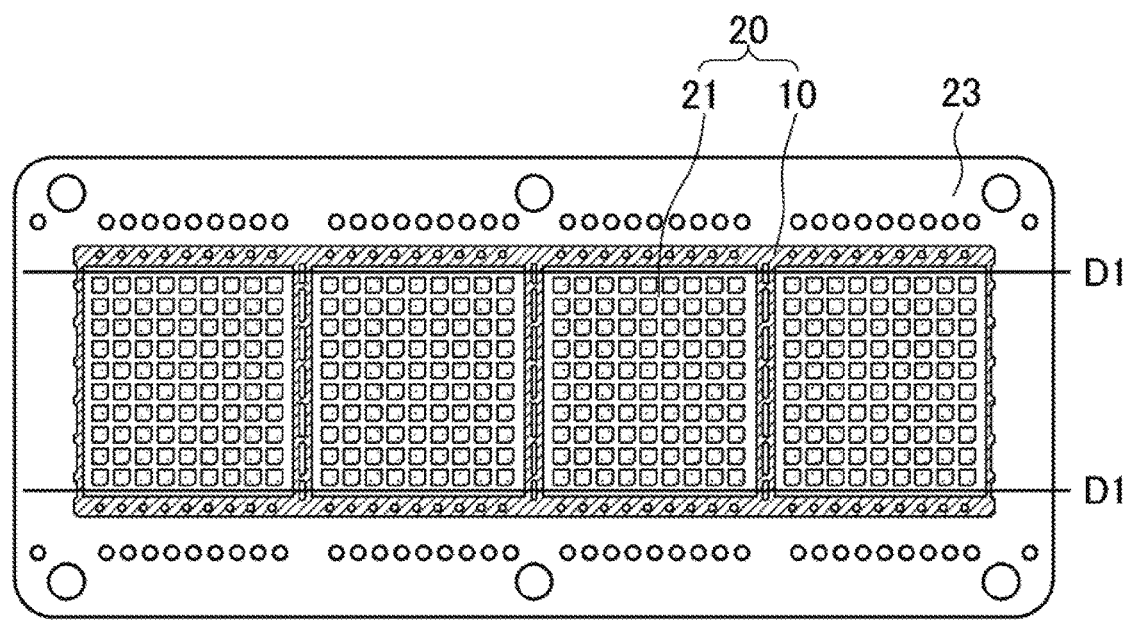
FIG. 5D is a schematic plan view for illustrating a method of manufacturing a light emitting device according to one embodiment of the present disclosure.

When the resin-attached lead frame 20 is formed using the lead frame 10 having a long side extending in the first direction (X-direction) as shown in FIG. 4A and FIG. 4B, one or more blocks each having a plurality of the unit structures U arranged in the first direction (X-direction) and the second direction (Y-direction) as shown in FIG. 5D can be included. In the resin-attached lead frame 20 shown in FIG. 5D, the unit structures U are arranged in a matrix of 10×9 in each of the blocks. The resin member 21 is integrally formed over a plurality of unit structures U adjacent to one another.

As shown in FIG. 5C, the resin-attached lead frame 20 includes a plurality of unit structures U of the lead frame 10, each unit structure is formed with a recess 20a for mounting an optical element. Each recess 20a for mounting an optical element is defined by an upward-facing surface 20b that is a portion of a first surface of the lead frame 10 including a portion of the first lead portion 11 and a portion of the second lead portion 12 and surfaces of lateral wall 20c formed by the resin member 21.

A single unit structure at least includes a first lead portion 11 and a second lead portion 12. The first lead portion 11 and the second lead portion 12 included in a single unit structure U are the first lead portion 11 and the second lead portion 12 exposed in the recess 20a for mounting an optical element in the single unit.

The second surface of the lead frame 10 that is a lower surface of the lead frame 10 may be embedded in the resin member 21, but preferably exposed. In other words, the lower surface of the lead frame 10 is preferably formed coplanar to the lower surface of the resin member 21, for example, formed coplanar to the outer surface of the resin member 21 disposed between the first lead portion 11 and the second lead portion 12 (as indicated by an arrow G in FIG. 5C). With this arrangement, heat dissipation from the lead frame 10 can be enhanced. Exposing the second surface of the lead frame 10 from the resin member allows for obtaining the light emitting device of a smaller size.

When the holders 17 are cut along the second direction (Y-direction), the upper surfaces of the resin member 21 located over the holders 17 are preferably on the same plane (as indicated by an arrow H in FIG. 5C). With this arrangement, a change in the load on the rotary blade can be reduced, which can reduce the positional deviation of the rotary blade can be reduced. When cutting the coupling portions along the first direction (X-direction), the upper surfaces of the resin member located over the coupling portions are preferably on the same plane.

The lead frame 10 and the resin member 21 can be formed in one body by using a method such as transfer molding, injection molding, compression molding, or other appropriate methods.

For the resin member 21, a thermosetting resin, a thermoplastic resin, or the like can be used as a base resin material. Specific examples of the base resin material include epoxy resin composition, silicone resin composition, modified epoxy resin composition such as silicone-modified epoxy resin composition, modified silicone resin composition such as epoxy-modified silicone resin, unsaturated polyester resin, saturated polyester resin, polyimide resin composition, modified polyimide resin composition, polyphthalamide (PPA), polycarbonate resin, polyphenylenesulfide (PPS), liquid crystal polymer (LCP), ABS resin, phenol resin, acrylic resin, and PBT resin. In particular, a thermosetting resin such as an epoxy resin composition, a silicone resin composition, or a modified silicone resin composition is preferably used.

It is preferable that the resin member 21 further contains a light-reflecting substance. Examples of the light-reflecting substance include titanium oxide, silicon oxide, zirconium oxide, potassium titanate, aluminum oxide, zinc oxide, aluminum nitride, boron nitride, and mullite. The resin member 21 containing the light-reflecting substance can efficiently reflect light emitted from the light emitting element 22. For example, titanium oxide can be contained preferably in a range of 20 to 60 weight %, more preferably in a range of 25 to 55 weight % with respect to the total weight of the resin member 21. The resin member 21 preferably has a reflectance of 60% or greater, preferably 90% or greater, to the light from the light emitting element 22.

Mounting Light Emitting Element

Next, as shown in FIG. 5C, light emitting elements are disposed on the first surface of the first lead portion 11 or the first surface of the second lead portion 12 in each of the recesses for mounting an optical element. For example, one or more light emitting elements 22 are mounted on the first surface that is the upper surface of the second lead portion 12 having a planar dimensions greater than that of the first lead portion 11 and located on the upward-facing surface 20b of each of the recesses 20a for mounting an optical element. Each of the light emitting elements 22 can be mounted on respective portions of the lead frame through a bonding member. Each of the light emitting element 22 is electrically connected to the first lead portion 11 and the second lead portion 12 using wires or the like.

Figure 6A:
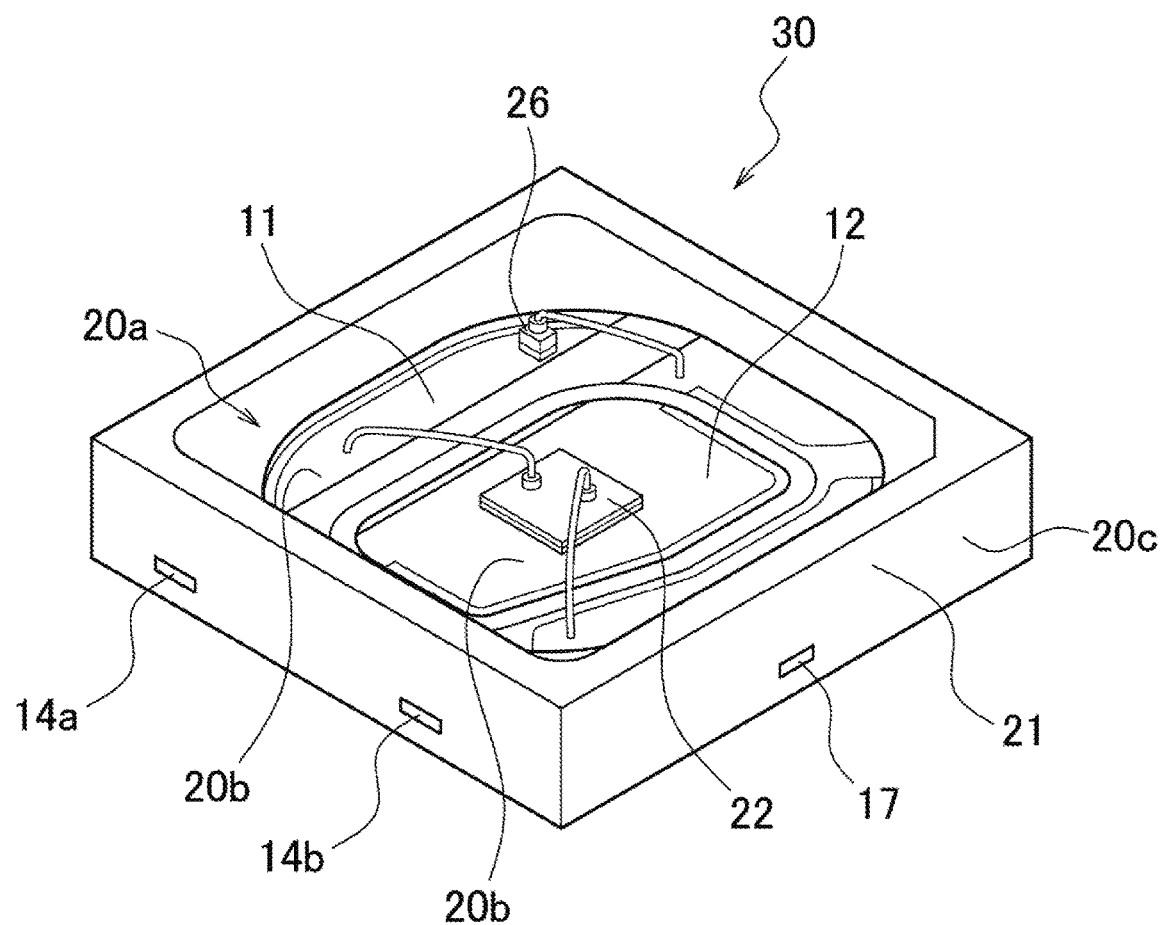
FIG. 6A is a schematic downward perspective view of an upper side of a singulated light emitting device.

When a protective element is used, it is preferable as shown in FIG. 6A, the protective element 26 is disposed on the first lead portion 11 or the second lead portion 12 in the recess 20a for mounting an optical element, for example on the first lead portion 11, and using a wire or the like, electrically connected in parallel to the light emitting element 22. Examples of the protective element 26 includes a Zener diode that is configured to protect the light emitting element 22 from static electricity and high-voltage surge.

After disposing the light emitting element 22, a sealing member to cover the light emitting element 11, etc., is preferably disposed in the recess 20a for mounting an optical element. With this arrangement, the light emitting element 22, etc., can be protected from an external force, dust, moisture, or the like. The sealing member preferably contains a fluorescent material, a light-diffusing material, etc., known in the art.

For the light emitting element 22, a semiconductor light emitting element such as a light emitting diode can be used preferably. The light emitting element 22 particularly preferably includes a nitride-based semiconductor ($In_xAl_yGa_{1-x-y}N$, $0 \leq x$, $0 \leq y$, $x+y \leq 1$) that can emit light in a range of ultraviolet to visible light. In the recess for mounting an optical element, a single light emitting element or two or more light emitting elements 22 can be mounted. When two light emitting elements are mounted in a single recess for mounting an optical element, for example, a blue light emitting element and a green light emitting element may be used. When three light emitting elements are mounted in a single recess for mounting an optical element, for example, a blue light emitting element, a green light emitting element, and a red light emitting element may be used. When two or more light emitting elements 22 are used, the emitting elements can be electrically connected in series, in parallel or in a combination of series and parallel. The light emitting elements can be mounted in a face-up manner in which the electrode forming surface is facing upward, or in a flip-chip manner in which the electrode forming surface is facing downward.

For the bonding member used for fixing the light emitting elements 22 on the first surface of the lead, for example, a solder such as tin-bismuth-based solder, tin-copper-based solder, tin-silver-based solder, or gold-tin-based solder, an electrically conductive paste or a bump of silver, gold, palladium, or the like, an anisotropic conductive material, or a brazing material such as a low-melting-point metal can be used. The bonding member may contain a light-reflecting material. Examples of the light-reflecting material include titanium oxide, zinc oxide, silicon oxide, zirconium oxide, aluminum oxide, and aluminum nitride.

It is preferable that the sealing member can transmit 60% or greater, more preferably 90% or greater light emitted from the light emitting element 22. For the sealing member, a resin material similar to the resin material used for the resin member 21 can be used. As described above, the sealing member preferably contains a fluorescent material, a light-diffusing material, etc., known in the art.

Examples of the fluorescent material contained in the sealing member include yttrium aluminum garnet activated with cerium, lutetium aluminum garnet activated with cerium, nitrogen-containing calcium aluminosilicate (portion of calcium can be substituted with strontium) activated with europium and/or chromium, sialon activated with europium, silicate activated with europium, strontium aluminate activated with europium, and potassium fluosilicate activated with manganese. Examples of the light-diffusing material contained in the sealing member include titanium oxide, silicon oxide, zirconium oxide, and aluminum oxide.

Removing Outer Frame 13

Next, the outer frame 13 is removed from the resin-attached lead frame 20. For removing the outer frame 13, a cutting device used in a typical dicing performed in the manufacturing of a general semiconductor device can be preferably used. Such a cutting device may, for example, include a blade and a table.

Figure 5E:
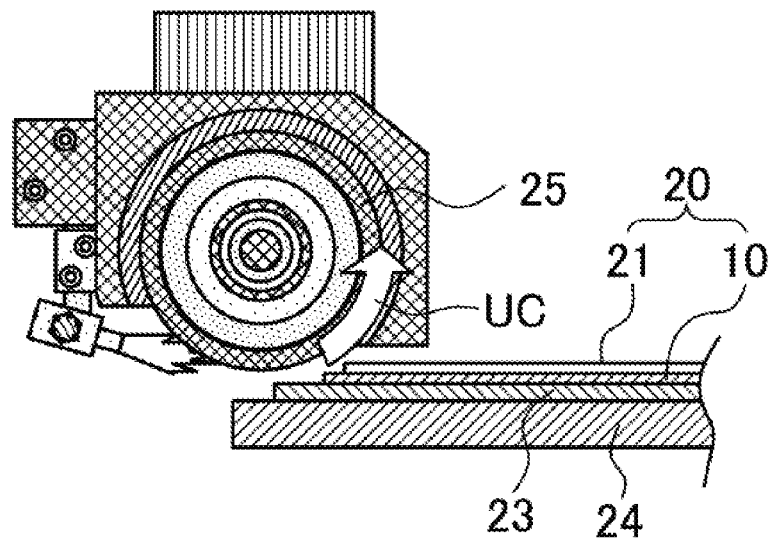
FIG. 5E is a schematic lateral surface view for illustrating up cutting in a method of manufacturing a light emitting device according to one embodiment of the present disclosure.
Figure 5F:
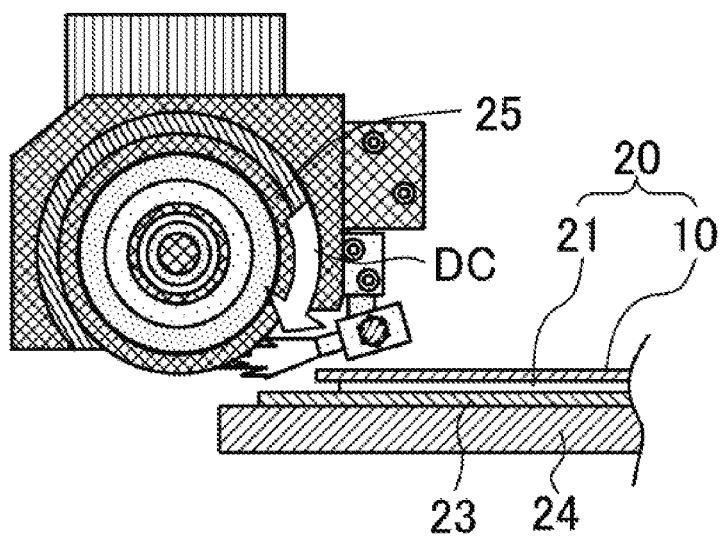
FIG. 5F is a schematic lateral surface view for illustrating down cutting in a method of manufacturing a light emitting device according to one embodiment of the present disclosure.

As shown in FIG. 5D and FIG. 5E, the resin-attached lead frame 20 is set on a jig 23 of a cutting device such that one surface side of the lead frame 10, for example, the first surface on which the light emitting element has been mounted faces upward. Alternatively, as shown in FIG. 5F, the resin-attached lead frame 20 is set on a jig 23 of a cutting device such that the second surface of the lead frame 10, which is the opposite side from the surface mounted with the light emitting element, faces upward. Then, as shown in FIG. 5E or FIG. 5F, the jig 23 of a cutting device is secured to the table 24 of the cutting device, and the table 24 is reciprocated in the first direction X relative to the blade 25. Accordingly, as shown in FIG. 5D, the resin-attached lead frame 20 is cut along the D1 lines by the blade 25, thus, portions of the outer frame 13 at long sides of the lead frame 20 can be removed. As described above, cutting the outer frame 13 along the long sides of the rectangular shape prior to cutting the lead frame along the short sides can reduce the number of reciprocating the table and reduce the consumption of the blade, which can facilitate efficient manufacturing of the light emitting device.

As shown in FIG. 5E and FIG. 5F, a rotary blade is preferably employed as the blade 25. The width of the rotary blade can be appropriately determined, but in view of using the same device when cutting in the first direction and when cutting in the second direction to be described below, a width greater than the width of the coupling portions 15 (W15 in FIG. 1B) of the lead frame 10 is preferable.

Cutting of the resin attached lead frame 20 can be carried out in an up-cutting (UC) mode as shown in FIG. 5E or in a down-cutting (DC) mode as shown in FIG. 5F. In the present specification, the term "up-cutting" mode refers to a cutting technique in which the rotation direction of the rotary blade is against a feed direction of the resin-attached lead frame 20. In up-cutting, a cutting edge of a rotary blade enters the lower side of the lead frame 10 and exits the upper side, cutting is made upward. In the present specification, the term "down-cutting" mode refers to a cutting technique in which the rotation direction of the rotary blade is along a feed direction of the resin-attached lead frame 20. In down-cutting, a cutting edge of a rotary blade enters the upper side of the lead frame 10 and exits the lower side, cutting is made downward.

As shown in FIG. 5E, the lead frame 10 is set on a jig 23 of a cutting device with the first surface of the lead frame 10 having the light emitting element(s) mounted thereon is facing upward in a third direction (Z-direction) that is perpendicular to the first direction (X-direction) and the second direction (Y-direction), and up-cutting may be performed. For example, when a sealing member is disposed in the recess for mounting an optical element, the sealing member may overflow from the recess for mounting an optical element. At the time of cutting, the sealing member overflown from the recess may be stretched and adhered on a lateral surface of the light emitting device, but when the lead frame is set on a jig 23 of a cutting device with the first surface of the lead frame having the light emitting element(s) mounted thereon facing upward and up-cutting is performed, stretching of the sealing member overflowed from the recess and adhered on a lateral surface of the light emitting device can be prevented.

As shown in FIG. 5F, the lead frame 10 is set on a jig 23 of a cutting device with the first surface of the lead frame having the light emitting element(s) mounted thereon is facing downward in a third direction (Z-direction), and down-cutting may be performed. For example, when the light emitting element(s) is mounted on the upward-facing surface of the recess for mounting an optical element, due to the presence of the lateral surfaces of the recess for mounting an optical element, a distance from the first surface of the lead frame to an outer surface of the resin member can be increased. That is, the thickness of the resin member between the first surface of the lead frame and the surface located at a lower side of the resin member can be increased. In down-cutting, a cutting edge of a rotary blade enters the upper side of the lead frame and exits the lower side, cutting is made downward, such that an increase in the thickness of the resin member between the first surface of the lead frame and the surface located at a lower side of the resin member can reduce or prevent chipping of the resin member.

As described above, the lead frame 10 has a structure in which, between the outer frame 13 extending in the first direction (X-direction) and the first group G1 or the second group G2 adjacent to the outer frame 13 extending in the first direction, a portion connecting to the outer frame 13 extending in the second direction (Y-direction) is not provided to at least one of the first extending portion 14a and the second extending portion 14b located at both ends in the first direction. With this arrangement, at the time of separating the outer frame 13 and the first group G1 or the second group G2 adjacent to the outer frame 13 along the first direction using a blade, at the initiation or at the ending of cutting the lead frame, only the portions of the resin member, absent of the coupling portion, can be subjected to the cutting. Accordingly, gradual transition of cutting from the resin member to the lead frame or gradual transition of cutting from the lead frame to the resin member can be achieved, such that stress on the rotary blade can be gradually changed. As a result, a positional deviation of the blade can be efficiently reduced or prevented.

Figure 5G:
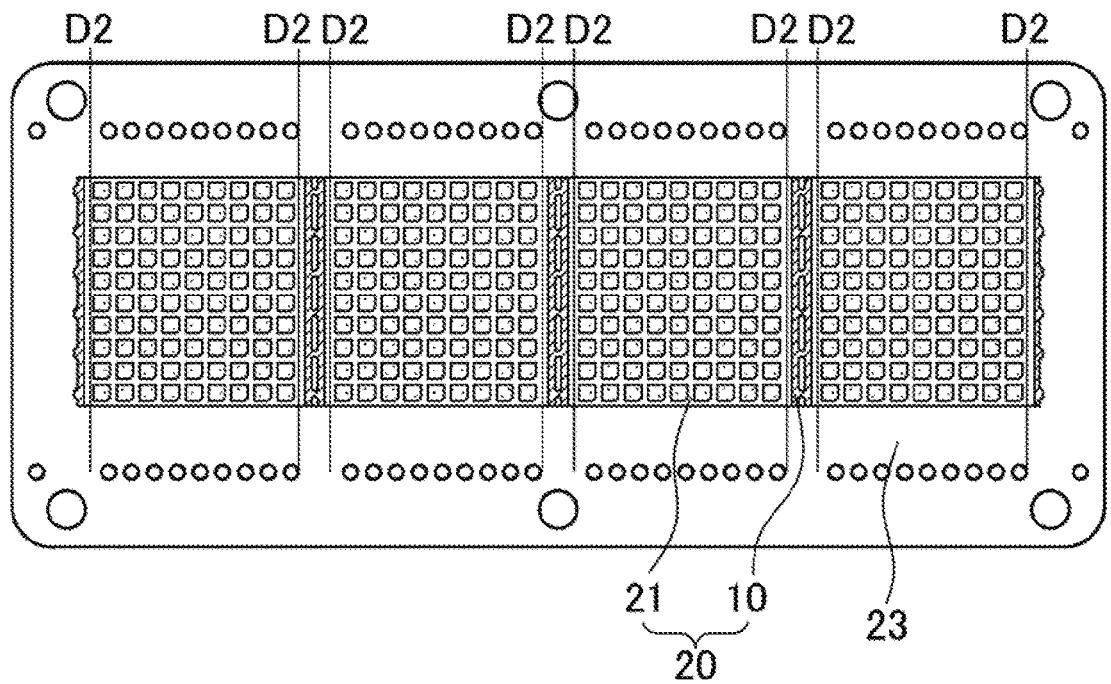
FIG. 5G is a schematic plan view for illustrating a method of manufacturing a light emitting device according to one embodiment of the present disclosure.

The outer frame 13 extending in the second direction (Y-direction) can be removed by as shown in FIG. 5E or FIG. 5F, placing the resin attached lead frame 20 on a table 24 of a cutting device and performing cutting along lines D1 shown in FIG. 5G in a similar manner as described above. The removal of the outer frame 13 extending in the second direction (Y-direction) can be performed before the removal of the outer frame 13 extending in the first direction (X-direction) or after the removal of the outer frame 13 extending in the first direction (X-direction). According to the steps described above, cutting of the holding portions 17a and 17b can be performed.

Cutting Along First Direction

Figure 5H:
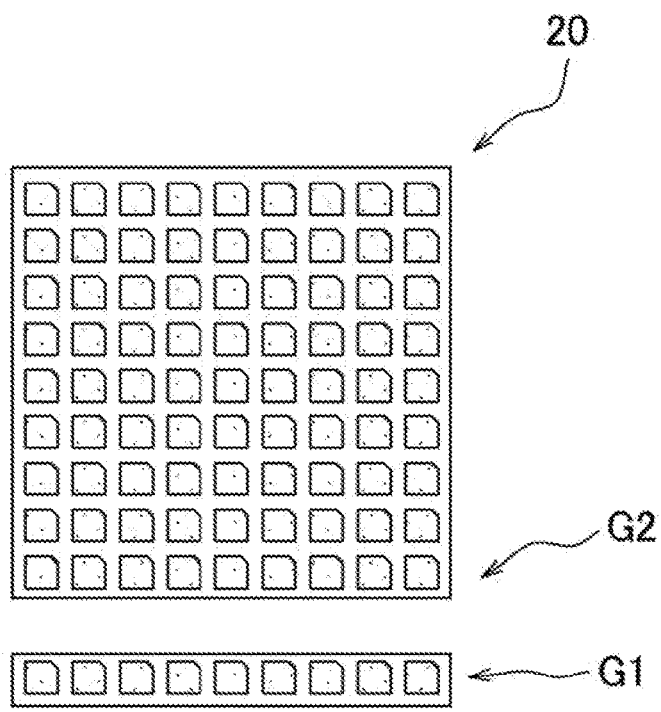
FIG. 5H is a schematic plan view for illustrating a method of manufacturing a light emitting device according to one embodiment of the present disclosure.

After removing at least the portions of the frame 13 extending in the first direction (X-direction), as shown in FIG. 5H, the first group G1 and the second group G2 adjacent to the first group G1 are separated by cutting the coupling portions 15 of the resin-attached lead frame 20 along the first direction (X-direction).

In the step of cutting along the first direction is preferably performed using a rotary blade as described above. The width of the rotary blade is preferably greater than the width of the coupling portions 15. With the step described above, all the coupling portions 15 disposed along a single virtual straight line in the first direction can be removed by a single cutting operation. The rotary blade preferably has a width in a range of 0.05 to 0.5 mm, preferably in a range of 0.1 to 0.3 mm.

As described above, the lead frame 10 has a structure in which, between the first group G1 and the second group G2 adjacent to the first group G1, a portion connecting to the outer frame 13 extending in the second direction (Y-direction) is not provided to at least one of the first extending portion 14a and the second extending portion 14b located at both ends in the first direction. With this arrangement, at the time of cutting the lead frame 10, etc. by using a blade, at the initiation or at the ending of cutting the lead frame, only the portions of the resin member, absent of the lead frame, can be subjected to the cutting. Accordingly, gradual transition of cutting from the resin member to the lead frame or gradual transition of cutting from the lead frame to the resin member can be achieved, such that stress on the rotary blade can be gradually changed. As a result, a positional deviation of the blade can be efficiently reduced or prevented.

When the first group and the second group are disposed alternately in the second direction (Y-direction), cutting can be performed by repetitively moving the table 24 of the cutting device from one end to the other end along the second direction (Y-direction) between the first group and the second group adjacent to the first group, and the portion between the second group and the first group adjacent to the second group, such that a matrix of the light emitting devices with the first lead portion 11 and the second lead portion 12 alternately adjacent to one other can be obtained. In the present specification, the term "matrix of the light emitting devices" refers to a state of the light emitting devices connected by a resin member prior to singulating.

Cutting Along Second Direction

After the step of cutting along the first direction, a step of cutting along the second direction is preferably performed.

Figure 5I:
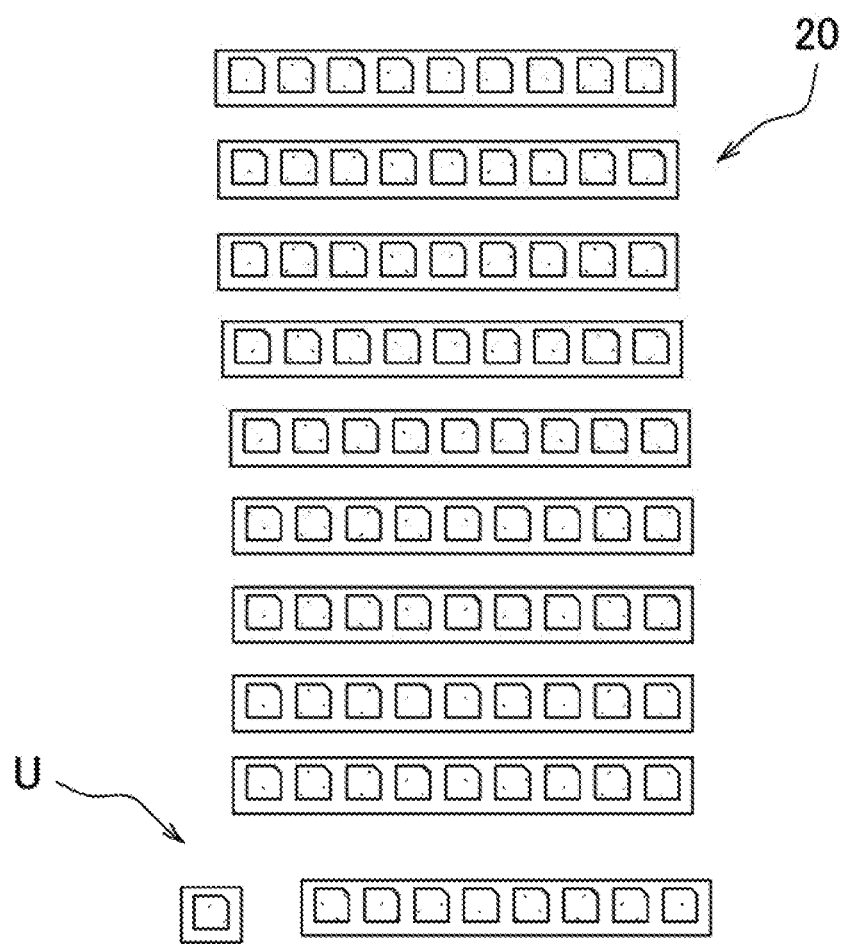
FIG. 5I is a schematic plan view for illustrating a method of manufacturing a light emitting device according to one embodiment of the present disclosure.

As shown in FIG. 5I, the holding portions 17 of the first group G1 and the second group G2 of the resin-attached lead frame 20 are cut along the second direction (Y-direction) to separate the unit structures U adjacent to each other in the second direction (Y-direction). The step of cutting along the second direction is preferably performed using a rotary blade as described above.

Figure 6B:
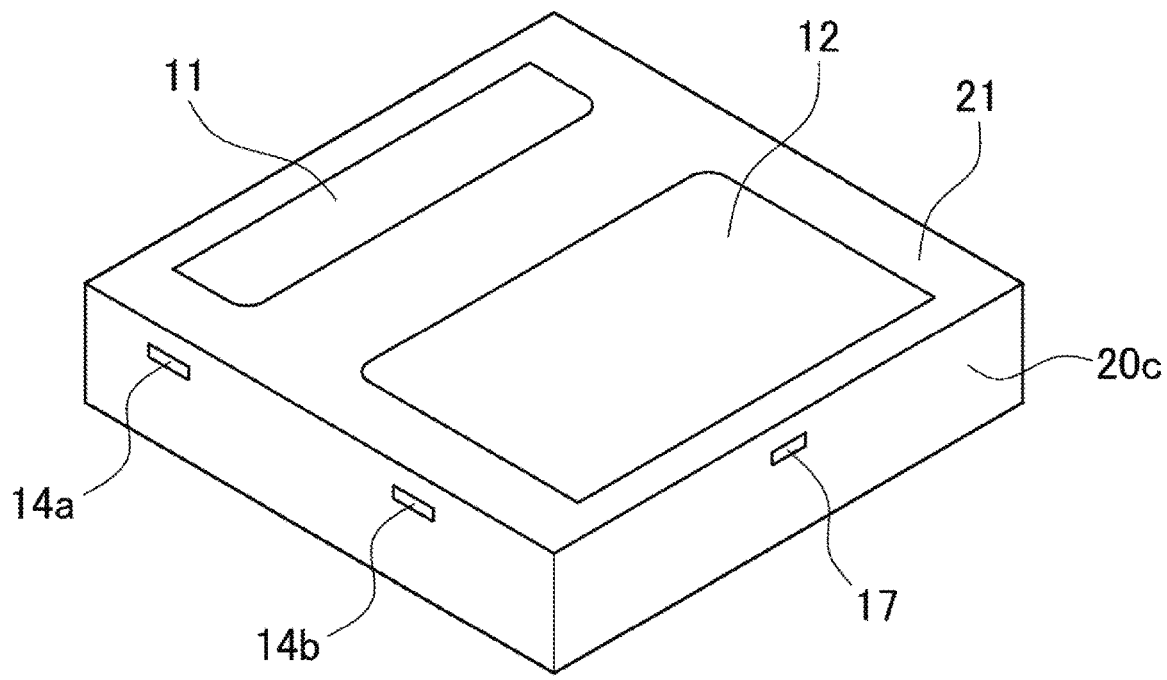
FIG. 6B is a schematic downward perspective view of a lower side of a singulated light emitting device.

In the step of cutting along the second direction, either up-cutting as shown in FIG. 5E or down-cutting as shown in FIG. 5F can be performed, as described above. Through such steps, the light emitting device package shown in FIG. 6A can be obtained. Also, as shown in FIG. 6B, the light emitting device package having the second surfaces of the lead portions and the outer surface of the resin member 21 are substantially on the same plane can be manufactured easily with a high precision and with a good yield through the use of the resin-attached lead frame 20 having the second surface of the lead frame and the outer surfaces of the resin members 21 substantially on the same plane (i.e., substantially flush with each other).

The embodiments of the present disclosure can facilitate the manufacturing of light emitting devices where dicing is employed. The embodiments of the present disclosure can be easily implemented not only in manufacturing light emitting devices but also in manufacturing semiconductor devices including a plurality of semiconductor elements resin-enclosed on a lead frame.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A lead frame comprising:
   a plurality of unit structures each including a first lead portion and a second lead portion aligned in a first direction, the unit structures being grouped into
      a first group including a plurality of the unit structures aligned in the first direction, and
      a second group including a plurality of the unit structures aligned in the first direction, the second group being adjacent to the first group in a second direction perpendicular to the first direction;
   an outer frame surrounding the first group and the second group;
   a plurality of extending portions each including a first extending portion extending in the second direction and connecting the first lead portion of one of the unit structures in the first group and the first lead portion of a corresponding one of the unit structures in the second group, and a second extending portion extending in the second direction and connecting the second lead portion of one of the unit structures in the first group and the second lead portion of a corresponding one of the unit structures in the second group; and
   a plurality of coupling portions located between the first group and the second group, and connecting all the first extending portions and the second extending portions located between the first group and the second group,
   wherein at least one of the extending portions located at one of ends in the first direction is not directly connected to the outer frame.

2. The lead frame according to claim 1, wherein
peripheries of the extending portions facing portions of the outer frame extending in the second direction are substantially in parallel to the second direction in a plan view.

3. The lead frame according to claim 1, wherein
the extending portions have widths in the second direction smaller than widths of the coupling portions in the first direction.

4. The lead frame according to claim 1, wherein
the extending portions have widths in the first direction smaller than widths of the second lead portions in the first direction.

5. The lead frame according to claim 1 further comprising
connecting portions connecting the outer frame and the first lead portion and the second lead portion respectively adjacent to the outer frame.

6. The lead frame according to claim 1, wherein
outer edges of the coupling portions are substantially in parallel to the first direction in a plan view.

7. The lead frame according to claim 1, wherein
an outer peripheral shape of the lead frame is a substantially rectangular shape in a plan view with longer sides being substantially in parallel to the first direction.

8. The lead frame according to claim 1, wherein
the extending portions are not directly connected to the outer frame between the first group and the second group.

9. A method of manufacturing a light emitting device, the method comprising:
providing a resin-attached lead frame including the lead frame according to claim 1 and a resin member covering a portion of the lead frame;
mounting at least one light emitting element on a first surface of the first lead portion or the second lead portion of each of the plurality of unit structures;
removing the outer frame from the lead frame; and
cutting the coupling portions of the lead frame along the first direction to separate the first group and the second group into each group.

10. The method of manufacturing a light emitting device according to claim 9, further comprising
cutting at least one holding portion of the lead frame along the second direction to separate the adjacent unit structures, the at least one holding portion being provided in the lead frame to connect the second lead portion of one of the unit structures and the first lead portion of an adjacent one of the unit structures in the first direction.

11. The method of manufacturing a light emitting device according to claim 10, wherein
the cutting of the at least one holding portion of the lead frame along the second direction is performed after the cutting of the coupling portions of the lead frame along the first direction.

12. The method of manufacturing a light emitting device according to claim 10, wherein
the cutting of the coupling portions of the lead frame along the first direction is performed by a rotary blade.

13. The method of manufacturing a light emitting device according to claim 12, wherein
the cutting of the at least one holding portion of the lead frame along the second direction includes down-cutting the resin-attached lead frame with respect to a third direction perpendicular to the first direction and the second direction while a surface of the resin-attached lead frame, on which the at least one light emitting element is to be mounted, faces downward.

14. The method of manufacturing a light emitting device according to claim 12, wherein
the cutting of the at least one holding portion of the lead frame along the second direction includes up-cutting the resin-attached lead frame with respect to a third direction perpendicular to the first direction and the second direction while a surface of the resin-attached lead frame, on which the at least one light emitting element is to be mounted, faces upward.

15. The method of manufacturing a light emitting device according to claim 12, wherein
the cutting of the coupling portions of the lead frame along the first direction includes cutting with the rotary blade having a width greater than a width of the coupling portions.

16. The method of manufacturing a light emitting device according to claim 9, wherein
the providing of the resin-attached lead frame includes providing the resin-attached lead frame defining a plurality of recesses for respectively mounting optical elements, each recess being defined by an upward-facing surface where a portion of a first surface of the lead frame is exposed from the resin member, and surfaces of lateral walls formed with the resin member, at least one light emitting element is to be mounted on the upward-facing surface, and a second surface of the lead frame located opposite side of the first surface and an outer surface of the resin member are substantially on the same plane.

\* \* \* \* \*